US012733459B2

(12) United States Patent
Tian et al.

(10) Patent No.: US 12,733,459 B2
(45) Date of Patent: Sep. 8, 2026

(54) PACKAGE STRUCTURE HAVING A SEMICONDUCTOR FUNCTIONAL STRUCTURE AND REDISTRIBUTION LAYERS (RDLs)

(71) Applicant: CHANGXIN MEMORY TECHNOLOGIES, INC., Hefei City (CN)

(72) Inventors: Kai Tian, Hefei City (CN); Hongwen Li, Hefei City (CN); Liang Chen, Hefei City (CN); Wei Jiang, Hefei City (CN)

(73) Assignee: CHANGXIN MEMORY TECHNOLOGIES, INC., Hefei City (CN)

(*) Notice: Subject to any disclaimer, the term of this patent is extended or adjusted under 35 U.S.C. 154(b) by 706 days.

(21) Appl. No.: 18/152,494

(22) Filed: Jan. 10, 2023

(65) Prior Publication Data

US 2023/0395543 A1 Dec. 7, 2023

Related U.S. Application Data

(63) Continuation of application No. PCT/CN2022/102504, filed on Jun. 29, 2022.

(30) Foreign Application Priority Data

Jun. 1, 2022 (CN) ......................... 202210620813.5

(51) Int. Cl.

*H10P 74/00* (2026.01)
*H10W 70/05* (2026.01)

(Continued)

(52) U.S. Cl.

CPC ........... *H10P 74/273* (2026.01); *H10W 70/05* (2026.01); *H10W 70/65* (2026.01);

(Continued)

(58) Field of Classification Search

CPC ......... H01L 24/06; H01L 24/02; H01L 24/03; H01L 24/05; H01L 22/32;

(Continued)

(56) References Cited

U.S. PATENT DOCUMENTS 5,554,940 A * 9/1996 Hubacher .......... G01R 1/07392 324/762.03
6,429,532 B1 8/2002 Han (Continued)

FOREIGN PATENT DOCUMENTS

CN 1819168 A 8/2006
CN 101821634 A 9/2010

(Continued)

OTHER PUBLICATIONS

Extended European search report in application No. 22925224, mailed on Sep. 17, 2024.

(Continued)

*Primary Examiner* — Wael M Fahmy
*Assistant Examiner* — Tiberiu Dan Onuta
(74) *Attorney, Agent, or Firm* — Syncoda LLC; Feng Ma

(57) ABSTRACT

A package structure includes an isolation layer with multiple vias, N first pads, N Redistribution Layers (RDLs), and a first insulating layer. Each via exposes a respective part of an interconnection layer arranged on a surface of a semiconductor functional structure. Each first pad is formed by a respective part of the interconnection layer exposed by the corresponding via, N is a positive integer greater than 1. Each RDL covers the isolation layer and is electrically connected to a corresponding one of the N first pads. The first insulating layer is formed on the RDLs and exposes a part area of each RDL. The exposed part areas of at least some of the RDLs includes second pads and third pads. The center point of each second pad has the same offset direction (Continued)

and the same offset distance with respect to the center point of the corresponding first pad.

10 Claims, 8 Drawing Sheets

(51) Int. Cl.
*H10W 70/65* (2026.01)
*H10W 70/652* (2026.01)
*H10W 70/654* (2026.01)
*H10W 70/66* (2026.01)
*H10W 72/00* (2026.01)
*H10W 72/90* (2026.01)

(52) U.S. Cl.
CPC ........ *H10W 70/652* (2026.01); *H10W 70/654* (2026.01); *H10W 70/66* (2026.01); *H10W 72/01935* (2026.01); *H10W 72/922* (2026.01); *H10W 72/926* (2026.01); *H10W 72/932* (2026.01); *H10W 72/952* (2026.01); *H10W 72/967* (2026.01)

(58) Field of Classification Search
CPC ... H01L 2224/0231; H01L 2224/02373; H01L 2224/02375; H01L 2224/02381; H01L 2224/0239; H01L 2224/03462; H01L 2224/05548; H01L 2224/05553; H01L 2224/05624; H01L 2224/0603; H01L 2224/06515; H01L 2224/02317; H01L 2224/02371; H01L 2224/0392; H01L 2224/06135; H01L 2224/06138; H01L 2924/01013; G11C 29/006; G11C 29/48; G11C 2029/5602
See application file for complete search history.

(56) References Cited

U.S. PATENT DOCUMENTS

2003/0065367 A1* 4/2003 Youker .................. H05K 1/189 607/36
2006/0113535 A1 6/2006 Lunde
2006/0186405 A1 8/2006 Tanabe
2006/0279001 A1 12/2006 Nishida
2009/0045827 A1 2/2009 Gangoso
2009/0134523 A1 5/2009 Yamazaki
2009/0243118 A1 10/2009 Akiba
2012/0077310 A1 3/2012 Akiba
2013/0193438 A1 8/2013 Akiba et al.
2014/0361299 A1 12/2014 Akiba et al.
2016/0035636 A1 2/2016 Akiba et al.
2016/0336244 A1 11/2016 Akiba et al.
2017/0062367 A1* 3/2017 Jo ......................... H10P 74/273
2017/0133333 A1 5/2017 Kim et al.
2017/0229359 A1 8/2017 Akiba et al.
2018/0145001 A1 5/2018 Akiba et al.
2018/0275169 A1 9/2018 Jacobs
2018/0356444 A1 12/2018 Ganapol et al.
2019/0006249 A1 1/2019 Pedersen
2019/0057756 A1 2/2019 Kim et al.
2019/0057913 A1 2/2019 Akiba et al.
2019/0221535 A1* 7/2019 Shin ...................... H10P 74/277
2019/0252332 A1 8/2019 Kim et al.
2019/0348332 A1 11/2019 Akiba et al.
2020/0265913 A1 8/2020 Kim et al.
2021/0343632 A1* 11/2021 Huang ................ H10W 70/611
2022/0352103 A1 11/2022 Chen et al.
2024/0027506 A1 1/2024 Wane

FOREIGN PATENT DOCUMENTS

CN 103344791 A 10/2013
CN 106684063 A 5/2017
CN 108630562 A 10/2018
CN 110120357 A 8/2019
CN 111244057 A 6/2020
CN 111554690 A 8/2020
CN 112782561 A 5/2021
CN 113284873 A 8/2021
KR 20170017510 A 2/2017
TW 200949970 A 12/2009
TW 202119509 A 5/2021
TW 202133376 A 9/2021
TW M618418 U 10/2021
TW 202141712 A 11/2021
TW 202145375 A 12/2021
TW 202201578 A 1/2022
WO 2022058590 A1 3/2022

OTHER PUBLICATIONS

Second Office Action of the Taiwanese application No. 111141327, issued on Feb. 22, 2024. 13 pages with English abstract.

* cited by examiner

PACKAGE STRUCTURE HAVING A SEMICONDUCTOR FUNCTIONAL STRUCTURE AND REDISTRIBUTION LAYERS (RDLs)

CROSS-REFERENCE TO RELATED APPLICATIONS

This is a continuation of International Application No. PCT/CN2022/102504 filed on Jun. 29, 2022, which claims priority to Chinese Patent Application No. 202210620813.5 filed on Jun. 1, 2022. The disclosures of the above-referenced applications are hereby incorporated by reference in their entirety.

BACKGROUND

With the rapid popularization of electronic devices and the booming development of the electronic device market, more and more electronic products are required to evolve in the direction of miniaturization and thinness while having high performance, multifunction, high reliability and convenience. The package of a semiconductor device is required to be better, lighter, thinner, higher in packaging density, better in electrical and thermal performance, higher in reliability and higher in cost performance.

For ensuring that the performance of the semiconductor devices meets the corresponding requirements, it is necessary to prepare ports for testing and performing function interaction on a package structure.

SUMMARY

The present disclosure relates to the technical field of semiconductors, and in particular to, but not limited to, a package structure and a manufacturing method thereof, and a semiconductor device.

According to an aspect of the embodiments of the present disclosure, a package structure is provided, which may include: an isolation layer with multiple vias, N first pads, N Redistribution Layers (RDL), and a first insulating layer.

The isolation layer covers a surface of an interconnection layer, each of the vias exposes a respective part of the interconnection layer, and the interconnection layer is arranged on a surface of a semiconductor functional structure.

Each of the N first pads is formed by a respective part of the interconnection layer exposed by a corresponding one of the vias, where N is a positive integer greater than 1.

Each of the RDLs covers the isolation layer and is electrically connected to a respective one of the N first pads.

The first insulating layer is formed on the RDLs and exposes a part area of each of the RDLs.

The exposed part areas of at least some of the RDLs comprise second pads and third pads, wherein a center point of each of the second pads has a same offset direction and a same offset distance with respect to a center point of a corresponding one of the first pads, the first pads and the second pads are used for testing when the semiconductor functional structure is at different running speeds respectively, and the third pads are used for performing function interaction corresponding to content tested by the second pads.

According to another aspect of the present disclosure, a semiconductor device is provided, which may include: a semiconductor functional structure and the package structure as described in any above embodiment of the present disclosure.

In the above solution, the semiconductor device may further include:

a substrate and multiple stacked dies.

Each die includes a semiconductor functional structure and a package structure located on the semiconductor functional structure.

Each of the dies is electrically connected to the substrate through a lead on a respective one of the third pads in the package structure.

According to yet another aspect of the embodiments of the present disclosure, a method for manufacturing a package structure is provided, which may include the following operations.

A semiconductor functional structure is provided. A surface of the semiconductor functional structure is provided with an interconnection layer.

An isolation layer with multiple vias is formed. The isolation layer covers a surface of the interconnection layer. Each of the vias exposes a respective part of the interconnection layer. Each part of the interconnection layer exposed by a respective one of the vias is used as a first pad, to form N first pads. The first pads are used for performing first-type test, where N is a positive integer greater than 1.

After the first-type test is completed, N RDLs are formed on the N first pads and the isolation layer. Each of the RDLs covers the isolation layer and is electrically connected to a respective one of the N first pads.

A first insulating layer is formed on the RDLs to expose a part area of each of the RDLs. The exposed part areas of the RDLs are used as second pads and third pads. A center point of each of the second pads has a same offset direction and a same offset distance with respect to a center point of a corresponding one of the first pads. The second pads are used for performing second-type test, and the third pads are used for performing function interaction corresponding to content of the second-type test. A running speed of the semiconductor functional structure when performing the first-type test is lower than that of the semiconductor functional structure when performing the second-type test.

DESCRIPTIONS OF REFERENCE SIGNS

Figure 1:
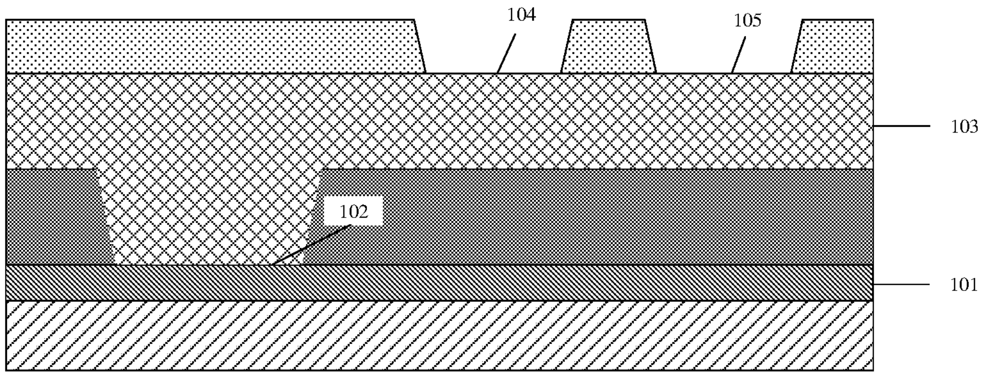
FIG. 1 is a section view of a package structure according to an embodiment of the present disclosure.

101: top metal layer; 102: first pad; 103: RDL; 104: second pad; 105: third pad; 200: semiconductor functional structure; 201: semiconductor functional layer; 202: interconnection layer; 203: isolation layer; 204: via; 205: first pad; 206: RDL; 207: conductive pole; 208: first insulating layer; 209: groove; 210: second insulating layer; 211: second pad; 212: third pad; 600: semiconductor functional structure; 601: semiconductor functional layer; 602: interconnection layer; 603: isolation layer; 604: via; 605: first pad; 606: RDL; 608: first insulating layer; 609: groove; 610: second insulating layer; 611: second pad; 612: third pad.

In the accompanying drawings (not necessarily drawn to scale), the similar reference signs may describe the similar parts in different views. The similar reference signs with different suffix letters may represent different examples of the similar parts. The accompanying drawings generally show, by example rather than by limitation, the embodiments discussed in the present application.

DETAILED DESCRIPTION

The technical solutions of the present disclosure will further be elaborated below in combination with the drawings and the embodiments. Although the exemplary implementation modes of the present disclosure are shown in the drawings, it should be understood that the present disclosure may be implemented in various forms and shall not be limited by the implementation modes described here. Rather, these implementation modes are provided in order to have a more thorough understanding of the present disclosure and to be able to fully convey the scope of the present disclosure to those skilled in the art.

The embodiments of the present disclosure are more specifically described below by means of examples. The advantages and features of the present disclosure will be clearer according to the following specification and claims. It is to be noted that the accompanying drawings are all in a very simplified form with imprecise proportion to assist in illustrating the purpose of the embodiments of the present disclosure easily and clearly.

It can be understood that the meaning of "on", "over" and "above" in the present disclosure should be interpreted in the broadest possible way, so that "on" means not only that an object is on something without intermediate features or layers (that is, the object is directly on something), but also that an object is on something with intermediate features or layers.

In the embodiments of the present disclosure, the term "A is connected to B" includes either direct contact between A and B, or indirect contact between A and B through an intermediate conductive structure.

Terms "first", "second" and the like in the embodiments of the present disclosure are adopted to distinguish similar objects and not intended to describe a specific sequence or order.

In the embodiments of the present disclosure, term "layer" refers to a material part that includes an area with a thickness. The layer may extend on the lower surface or the upper surface of the structure, and its area may be less than or equal to the extension surface where it is located. It is to be noted that the technical solutions recorded in the embodiments of the present disclosure may be freely combined without conflicts.

The semiconductor functional structure involved in the embodiments of the present disclosure is a part that will be used in the subsequent manufacturing process to form the final semiconductor device, and is a core part for realizing the main function of the semiconductor device. Here, the final semiconductor device may include, but is not limited to, a memory device.

In the design of a package structure of semiconductor devices, such as a Dynamic Random Access Memory (DRAM), a pad (also known as a bonding pad) may be set in two ways: top metal opening and Redistribution Layer (RDL) opening.

The top metal opening refers to forming a passivation layer or an insulating layer on the top metal layer of the semiconductor functional structure to protect the semiconductor functional structure from being damaged, and then forming opening areas on the passivation layer or the insulating layer to expose part of the top metal layer to form a pad. Nail penetration test with a probe card may be performed on the pad to realize the electrical performance test of the semiconductor functional structure. A bonding wire may also be led out on the pad to achieve electrical lead-out of the semiconductor functional structure.

The RDL opening refers to forming an RDL on the top metal layer of the semiconductor functional structure, forming a passivation layer or an insulating layer on the RDL, and then forming opening areas on the passivation layer or the insulating layer to expose part of the RDL and form two pads arranged in parallel. One of the two pads is used for performing the nail penetration test with a probe card, and the other is used for leading out the bonding wire on the pad. Here, the RDL may play the role of adjusting the position of the pad in the semiconductor device, and may also play the role of enhancing a power supply network of the power ground.

It can be understood that, the top metal layer is relatively thin, and there is a gasket structure below the top metal layer, which can support that on the same metal area of opening, after the nail penetration test with a probe card, bonding wire packaging is performed in a packaging plant without affecting the yield of wire bonding in packaging. The material of the RDL is also usually metal. The RDL is thicker than the top metal layer, there will be a deep and rough probe mark after the nail penetration with the probe card, and this probe mark will affect the yield of wire bonding in packaging, so the pads used for testing and for leading out the bond wire in the RDL need to be distinguished. No matter which opening way is used in the package structure, the function of the semiconductor device is not greatly affected. The RDL opening is beneficial to the performance improvement, but would increase the production cycle and production cost.

In some implementations, one of the above two opening ways is generally selected to design the package structure according to the actual needs of the semiconductor device. However, in the practical applications, there are often multiple requirements in the production process of the semiconductor device. Some examples of multiple requirements are given below.

Exemplarily, there is a long function debugging process before the mass production of the semiconductor devices (or "products"). In the debugging process, testing is completed at a low running speed of the semiconductor functional structure; in this case, the way of top metal opening is enough to complete packaging and testing of the semiconductor functional structure. After the manufacturing process of the product is mature and the state of the semiconductor functional structure at a high running speed needs to be tested, the way of RDL opening is needed to perform packaging and testing.

Exemplarily, when the semiconductor functional structure has different functional requirements, the same semiconductor functional structure may be divided into standard grade test and advanced grade test according to the different requirements, and different test grades have different requirements for the opening way of the semiconductor functional structure. In the standard grade test of the semiconductor functional structure, the way of top metal opening may be used for packaging and testing, and the effect of the RDL is not obvious. In the advanced grade test of the semiconductor functional structure, it is necessary to use the way of RDL opening to perform packaging and testing, so as to improve the product performance.

Based on this, an embodiment of the present disclosure provides a package structure. Referring to FIG. 1, the package structure includes the way of top metal opening and the way of RDL opening. In the way of top metal opening, first pads 102 are provided in a top metal layer 101; the first pads 102 may be used for performing low-speed test and leading out the bonding wire. In the way of RDL opening, there are two types of pads (i.e., second pads 104 and third pads 105) provided in the RDL 103; the second pads 104 are used for performing the high-speed test, and the third pads 105 are used for leading out the bonding wire. Thus, in the embodiments of the present disclosure, the package structure compatible with two types of tests (i.e., low-speed test and high-speed test) meets the requirements for different types of tests of the semiconductor functional structures in different manufacturing stages, improves the flexibility of testing, and reduces the production cycle and production cost.

Here, when performing the low-speed test by using the first pads 102, the testing probe card needs to be connected simultaneously to the center points of all the first pads 102; when performing the high-speed test by using the second pads 104, the testing probe card needs to be connected simultaneously to the center points of all the second pads 104. However, it can be seen from FIG. 1 that the first pads 102 and the second pads 104 are at different layers of the package structure, and the relative positions of each first pad 102 and each second pad 104 at different layers are different. Thus, in order to meet the requirements of the low-speed test and the high-speed test, it is necessary to make two sets of testing probe cards, which will greatly increase test cost and test time.

Based on this, the embodiments of the present disclosure also provide a package structure and a manufacturing method thereof, and a semiconductor device. The package structure may include: an isolation layer with multiple vias; N first pads; N RDLs; and a first insulating layer. The isolation layer covers the surface of an interconnection layer, each of the vias exposes a respective part of the interconnection layer, and the interconnection layer is arranged on a surface of a semiconductor functional structure. Each of the N first pads is formed by a respective part of the interconnection layer exposed by a corresponding one of the vias, where N is a positive integer greater than 1. Each RDL covers the isolation layer and is electrically connected to a respective one of the N first pads. The first insulating layer is formed on the RDLs and exposes a part area of each of the RDLs. The exposed part areas of at least some of the RDLs comprise second pads and third pads. A center point of each of the second pads has a same offset direction and a same offset distance with respect to a center point of a corresponding one of the first pads. The first pads and the second pads are used for testing when the semiconductor functional structure is at different running speeds respectively. The third pads are used for performing function interaction corresponding to content tested by the second pads.

Figure 2A:
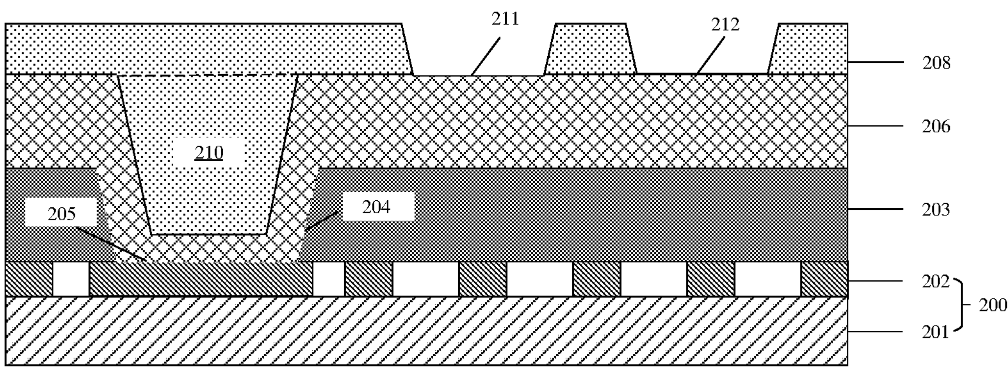
FIG. 2A is a section view of another package structure according to an embodiment of the present disclosure.

Here, referring to FIG. 2A, the package structure may include: a substrate, a semiconductor functional structure 200, and an isolation layer 203.

The constituent materials of the substrate (not shown in FIG. 2A) may include silicon (Si), germanium (Ge), silicon germanium (SiGe), Silicon on Insulator (SOI) or Germanium on Insulator (GOI).

The semiconductor functional structure 200 is located on the substrate. Specifically, the semiconductor functional structure 200 includes a semiconductor functional layer 201 and an interconnection layer 202 located on the surface of the semiconductor functional layer 201. According to the actual needs, a variety of functional structures may be arranged in the semiconductor functional layer 201. Accordingly, the interconnection layer 202 is used for leading out electrical signals of the functional structure in the semiconductor functional layer 201 to operate the functional structure. In some embodiments, the interconnection layer 202 includes a top metal layer, which is not only used for leading out the electrical signals of the functional structure, but also for supporting the semiconductor functional structure 200.

It is to be noted that, any signal connected to the RDL formed in the subsequent manufacturing process is connected to the interconnection layer 202, that is, the complete function of the semiconductor functional structure 200 is ensured in the absence of the RDL. FIG. 2A shows a section view of a section of the interconnection layer 202 with parts removed. In practical applications, the parts in the interconnection layer are not truncated but interconnected, that is, in other cross sections, the parts in the interconnection layer may be continuous.

The isolation layer 203 covers the surface of the interconnection layer 202, and is used for isolating the interconnection layer 202 and the RDLs 206 formed later in some areas. Vias 204 are arranged in the isolation layer 203. Each of the vias 204 exposes a respective part of the interconnection layer 202. The vias 204 may be of a cylindrical shape, or an inverted trapezoidal shape, or any proper shape. The constituent materials of the isolation layer 203 include, but are not limited to, tetraethyl orthosilicate (TEOS).

The part of the interconnection layer 202 exposed by one via 204 forms a first pad 205. The isolation layer 203 may include multiple vias to form multiple first pads 205 exposed by the vias 204. Here, the first pads 205 may be used for performing first-type test on the one hand, and for performing the function interaction corresponding to the content of the first-type test on the other hand. Exemplarily, the first-type test may be understood as some tests performed on the semiconductor functional structure at a low running speed. It is to be noted that, in a memory device, the running speed refers to a reading and writing speed of the memory device. Performing the function interaction corresponding to the content of the first-type test may be understood as leading out the bonding wire on the first pad. That is, when performing the first-type test, the first pad 205 may be used for contacting the probe card, and multiple probes in the probe card are in one-to-one correspondence to the N first pads, so as to realize the electrical connection between the interconnection layer and other test systems.

Referring to FIG. 2A, there is an RDL 206 on the surface of the isolation layer 203 and in the via 204. Here, the RDL 206 covers the isolation layer 203; moreover, the RDL 206 is in direct contact with the corresponding first pad 205. In other words, each first pad 205 may be used as an area where the corresponding RDL 206 is electrically connected to the interconnection layer 202.

The constituent materials of the RDL 206 include, but are not limited to, metal. Preferably, the material of the RDL 206 is aluminum (Al).

Figure 2B:
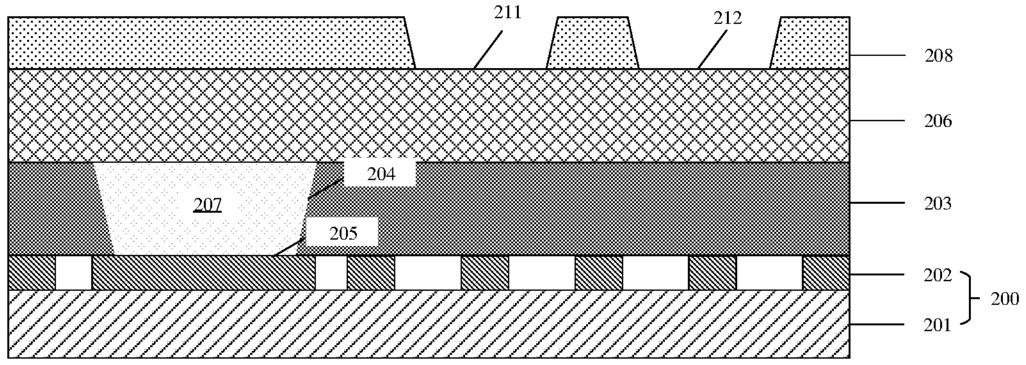
FIG. 2B is a section view of a package structure with a conductive pole(s) according to an embodiment of the present disclosure.

The RDL 206 and the first pad may be either in direct contact (referring to FIG. 2A), or in indirect contact, that is, a conductive material layer is arranged between the RDL 206 and the first pad 205 (referring to FIG. 2B).

In some embodiments, the RDL is in direct contact with the corresponding first pad. Alternatively, the package structure may further include: one or more conductive poles 207, each located between the RDL 206 and the corresponding first pad 205. The RDL 206 is conductively connected with the interconnection layer 202 through the conductive pole 207.

The constituent materials of the conductive pole 207 may be the same as or different from the constituent material of the RDL 206. Exemplarily, the constituent materials of the conductive pole 207 include aluminum (Al), cuprum (Cu), etc. It is to be noted that the height of the conductive pole 207 may be less than or equal to the depth of the via 204. FIG. 2B shows the case where the height of the conductive pole 207 is equal to the depth of the via 204.

It is to be noted that FIG. 2B shows a section effect view after the conductive pole 207 is filled in the via 204. In practical applications, the conductive pole 207 may also be arranged in other shapes or at other positions, or the shape of the conductive pole 207 is complementary to the shape of the via 204, that is, the conductive pole 207 fills the via 204.

Here, the orthographic projection of the conductive pole 207 on the plane where the interconnection layer 202 is located overlaps the first pad 205.

That is, the conductive pole 207 is located directly above the first pad 205, which is beneficial to the transmission of electrical signals between the semiconductor functional structure 200 and the RDL 206.

In the above embodiment, the number of conductive poles 207 in the same via 204 may be one or multiple, and the adjacent conductive poles 207 are isolated by an insulating material; accordingly, each of the conductive poles 207 corresponds to a respective one of the first pads 205, that is, when the number of conductive poles 207 is multiple, there are more than one first pad 205 at the bottom of the same via 204.

It can be understood that when the number of conductive poles 207 is multiple, each of the multiple conductive poles 207 is connected to a respective one of the RDLs 206 and the interconnection layer 202, so that the reliability of the electrical connection between the RDLs 206 and the interconnection layer 202 can be improved. In other words, in the package structure with multiple conductive poles 207, if a certain conductive pole fails to electrically connect an RDL 206 and the interconnection layer 202, the other remaining conductive poles may also connect the RDLs and the interconnection layer, thus improving the reliability of the electrical connection among the RDLs, the conductive pole and the interconnection layer.

It can be understood that, in the case that the base area of one via is fixed, arranging multiple first pads 205 is beneficial to reducing the total area of all the first pads 205 at the bottom of the same via 204, and then reducing the parasitic capacitance between the first pad 205 and the surrounding conductive materials, which is conducive to further optimizing the signal transmission performance.

It can be understood that the RDL 206 is directly arranged in the via 204, that is, the RDL 206 is in direct contact with the first pad 205, or only one conductive pole 207 is formed in the via 204, which can reduce the process of forming the conductive pole 207 and then improve the process efficiency.

Referring to FIG. 2A, there is a first insulating layer 208 on the RDL 206.

The first insulating layer 208, covering the surface of the RDL 206, may be used for isolating the electrical connection between the RDL 206 and other conductive materials on the one hand, and for protecting the RDL 206 from being damaged on the other hand. The materials of the first insulating layer 208 include, but are not limited to, polyimide (PI).

It is to be noted that the thickness of the exposed RDL 206 on the part of the interconnection layer 202 may be the same as the thickness of the RDL 206 on the surface of the isolation layer 203. In some embodiments, the diameter of the via 204 is twice the thickness of the RDL 206, the RDL 206 covers the side wall and bottom of the via 204, and the RDL 206 forms a groove 209.

In some embodiments, referring to FIG. 2A, the RDL is in direct contact with the corresponding first pad. The package structure may also include: a second insulating layer 210, which is located in the groove 209 formed by each RDL. The hardness of the material of the second insulating layer 210 is less than the hardness of the material of the RDL 206, so that on the one hand, the stress of the package structure can be reduced and the reliability of the package structure can be improved; on the other hand, compared with filling the groove 209 with the RDL 206, filling the groove 209 with the material of the second insulating layer 210 can avoid the generation of more parasitic capacitance.

In some embodiments, the material of the second insulating layer 210 may be the same as the material of the first insulating layer 208, or the hardness of the material of the second insulating layer 210 is less than that of the material of the first insulating layer 208, thereby further reducing the structural stress. Exemplarily, the constituent materials of the second insulating layer 210 include, but are not limited to, polyimide (PI). In some embodiments, the second insulating layer 210 and the first insulating layer 208 may also be an integrated structure.

Referring to FIG. 2A, part area of the first insulating layer 208 is removed, so that the exposed part area of at least some of the N RDLs 206 includes the second pads 211 and the third pads 212.

Here, each of the N RDLs 206 is provided with one second pad 211 and one third pad 211; in other words, N second pads 211 are in one-to-one correspondence to N third pads 212. The second pad 211 is used for performing second-type test, and the third pad 212 is used for performing the function interaction corresponding to the content of the second-type test. The second-type test may be understood as some tests performed on the semiconductor functional structure at a high running speed. Performing the function interaction corresponding to the content of the second-type test may be understood as leading out the bonding wire on the third pad.

In other words, the RDLs 206 are used for redistributing wire paths distributed based on the first pad 205. Here, the redistributed wire paths are more conducive to electrical test and the function interaction of the semiconductor device.

It is to be noted that the second pad 211 and the third pad 212 may be arranged continuously, that is, there is no partition wall between the second pad 211 and the third pad 212; or the second pad 211 and the third pad 212 may be spaced, that is, there is a partition wall between the second pad 211 and the third pad 212.

Here, when the second pad 211 and the third pad 212 are arranged continuously, the damage caused by the partition wall to the probe card when the probe does not aim can be avoided during the test, thus prolonging the service life of the probe card; at the same time, the production of impurities is reduced, thus improving the test efficiency; moreover, the damage of the probe card to the partition wall is reduced, thus improving the reliability of the package structure as a whole.

When there is a partition wall arranged between the second pad 211 and the third pad 212, the recognition precision of a machine platform for each pad can be improved during the test.

The following embodiments are described taking that a partition wall is arranged between the second pad 211 and the third pad 212 as an example. However, it can be understood that the following description of the partition wall is only used to illustrate the present disclosure but not to limit the scope of the present disclosure.

In some embodiments, the package structure may further include: one or more conductive poles. The orthographic projection of each of the conductive poles on the plane where the interconnection layer is located does not overlap the orthographic projection of the corresponding second pad and the corresponding third pad on the plane where the interconnection layer is located. In this way, the distance between each of the conductive poles and the corresponding second pad or the corresponding third pad can be increased, and then the stress damage caused by the conductive poles to the second pads or the third pads can be reduced.

In some embodiments, the second pads 211 are located at one end of the RDLs 206 close to the first pads 205, and the third pads 212 are located at another end of the RDLs 206 away from the first pads 205.

Here, when the same probe card is used to perform the first-type test and the second-type test, by placing the second pad relatively close to the corresponding first pad, the moving distance of the same probe card can be reduced, thus improving the test efficiency and reducing the probability of error.

In order to enable each probe in the probe card to correspond to the second pad when the probe card performs the second-type test, in the embodiments of the present disclosure, the center point of each second pad 211 is offset in the same direction and by an equal distance with respect to the center point of the corresponding first pad 205. In this way, relative positions between the N first pads and the N second pads can remain exactly the same. Thus, after performing the first-type test, the same probe card can be aligned with the center points of all the second pads 211 after moving a certain distance in a certain direction from the center point of the first pads 205, that is, the probe card can perform the second-type test directly on all the second pads to be tested without replacing the probe card with a new one. The way of setting the positions of the first pads and the second pads are described in detail below through two examples.

In some embodiments, the N first pads 205 are set near the first edge of the semiconductor functional structure in parallel along the first direction; at least some of the second pads and the corresponding third pads are all arranged in parallel along the second direction; the second direction is perpendicular to the first direction.

It is to be noted that, in the application example, when there are not many points to be tested, the number of corresponding first pads is not too large, so all the first pads may be set in parallel close to the edge of the semiconductor, that is, all the first pads are arranged in a single row; accordingly, the RDLs are also set close to the edge of the semiconductor, which can reduce the length of the subsequent bonding wire.

Here and below, the first direction is parallel to the surface of the semiconductor functional structure, and the second direction is parallel to the semiconductor functional structure and perpendicular to the first direction. In some embodiments, the first direction may be parallel to the X-axis direction, and the second direction may be parallel to the Y-axis direction. In some other embodiments, the first direction may also be parallel to the Y-axis direction, and the second direction may be parallel to the X-axis direction. In the following and the accompanying drawings, illustrations are given by taking that the first direction is parallel to the X-axis direction, and the second direction is parallel to the Y-axis direction as an example.

Here, the first edge may generally refer to any edge of the semiconductor functional structure.

Figure 3A:
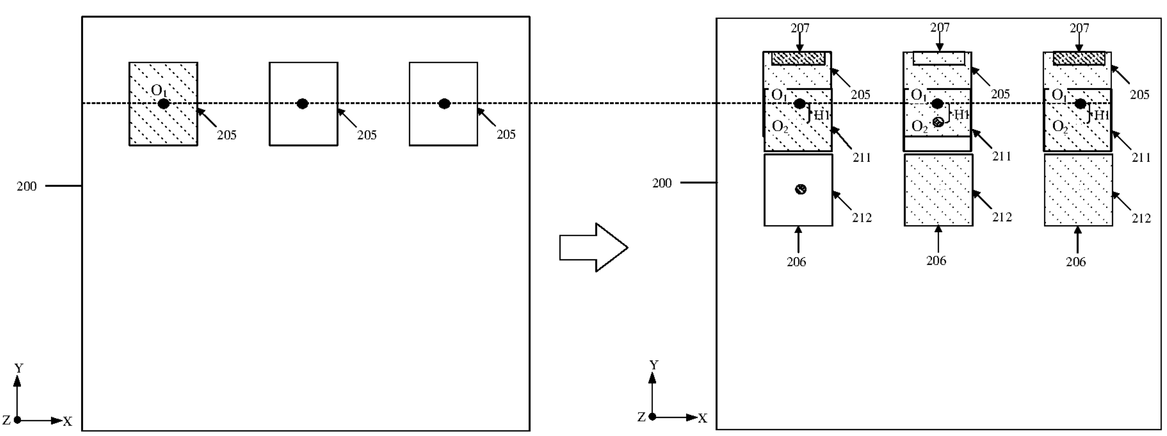
FIG. 3A is a schematic diagram of relative positions of first pads in a single row and second pads in a single row according to an embodiment of the present disclosure.

Exemplarily, referring to FIG. 3A, the left hand of the arrow in FIG. 3A shows that three first pads 205 are arranged near the first edge of the semiconductor functional structure in parallel along the X-axis direction; the right hand of the arrow in FIG. 3A shows that three RDLs are arranged close the first edge of the semiconductor functional structure in parallel along the X-axis direction. At the same time, both the second pads and the corresponding third pads in the RDLs are arranged in parallel along the Y-axis direction; the dotted line in FIG. 3A shows the line where the center points of three first pads 205 are located.

In some embodiments, the first pad 205, the second pad 211 and the third pad 212 are all of a long-strip shape, the width of each first pad 205 along the first direction is the same as the width of each second pad 211 and each third pad 212 along the first direction, and the length of each first pad 205 along the second direction is different from the length of each second pad 211 and each third pad 212 along the second direction. In some specific examples, the size of each first pad 205 is 45 μm×60 μm, and the size of each second pad 211 and each third pad 212 is 45 μm×55 μm.

In some embodiments, the orthographic projection of the center point of each second pad on the plane where the interconnection layer is located is offset by a first distance in the second direction with respect to the center point of the corresponding first pad.

Here, the first distance is the distance that the probe card moves from the center point of each first pad to the center point of the corresponding second pad after completing the first-type test.

Exemplarily, referring to FIG. 3A, the center point $O_2$ of each second pad is offset by the first distance H1 along the Y-axis direction with respect to the center point $O_1$ of the corresponding first pad.

In some embodiments, the shapes of the orthographic projection of each RDL 206 on the plane where the interconnection layer is located include a long-strip shape.

Figure 3B:
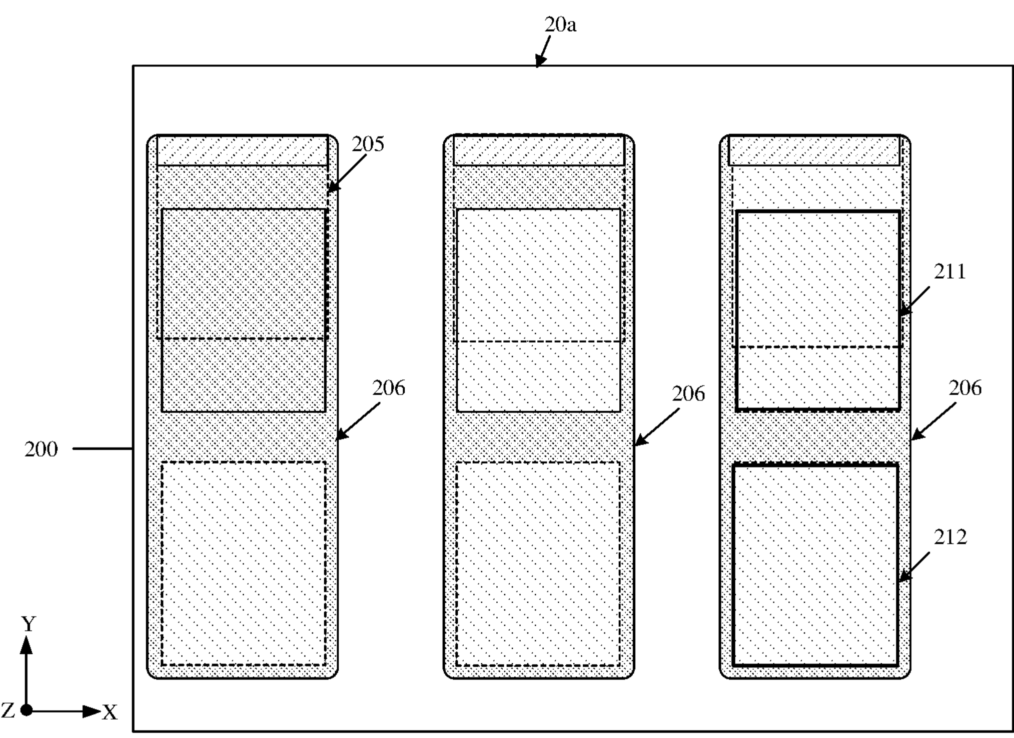
FIG. 3B is an enlarged view of the part area in FIG. 3A.

Exemplarily, referring to FIG. 3*b*, the shapes of the orthographic projection of the shape of each RDL 206 on the plane where the interconnection layer is located include a long-strip shape. In addition, it can be seen from FIG. 3*b* that, when the package structure includes the conductive pole(s), the orthographic projection of each of the conductive pole(s) on the plane where the interconnection layer is located overlaps the corresponding first pad, and the orthographic projection of each of the conductive pole(s) on the plane where the interconnection layer is located does not overlap the orthographic projection of the corresponding second pad and the corresponding third pad on the plane where the interconnection layer is located.

In some other embodiments, some of the first pads are arranged near the first edge of the semiconductor functional structure in parallel along the first direction; some of the second pads and the corresponding third pads are arranged in parallel along the second direction; the second direction is perpendicular to the first direction.

Rest of the first pads are arranged near a second edge of the semiconductor functional structure in parallel along the second direction. The first edge and the second edge are two opposite edges of the semiconductor functional structure. The second pads and the third pads corresponding to the rest first pads are arranged in parallel along the first direction.

It is to be noted that, in the application example, when there are a large number of points to be tested, the number of corresponding first pads is relatively large. In this case, the arrangement in a single row may not be able to arrange all the first pads, and then the first pads may be arranged in a T shape.

Here, the first edge 20*a* and the second edge 20*b* are two opposite edges of the semiconductor functional structure.

Here, the N first pads are divided into two parts, namely the first part and the second part. The first part includes M1 first pads, and the M1 first pads in the first part are arranged near the first edge 20*a* of the semiconductor functional structure in parallel along the first direction. The second part includes M2 first pads, and the M2 first pads in the second part are arranged near the second edge of the semiconductor functional structure in parallel along the second direction. Here, M1+M2=N.

Correspondingly, the N second pads are divided into two parts, namely the third part and the fourth part. The third part includes M1 second pads. The fourth part includes M2 second pads. The M1 second pads in the third part are arranged near the first edge of the semiconductor functional structure in parallel along the first direction. The M2 second pads in the fourth part are arranged near the second edge of the semiconductor functional structure in parallel along the second direction. Similarly, the N third pads are divided into two parts, namely the fifth part and the sixth part. The fifth part includes M1 third pads. The sixth part includes M2 third pads. The M1 third pads in the fifth part and M1 second pads are arranged near the first edge of the semiconductor functional structure in parallel along the first direction. The M2 third pads in the sixth part and M2 second pads are arranged near the second edge of the semiconductor functional structure in parallel along the second direction.

Figure 4A:
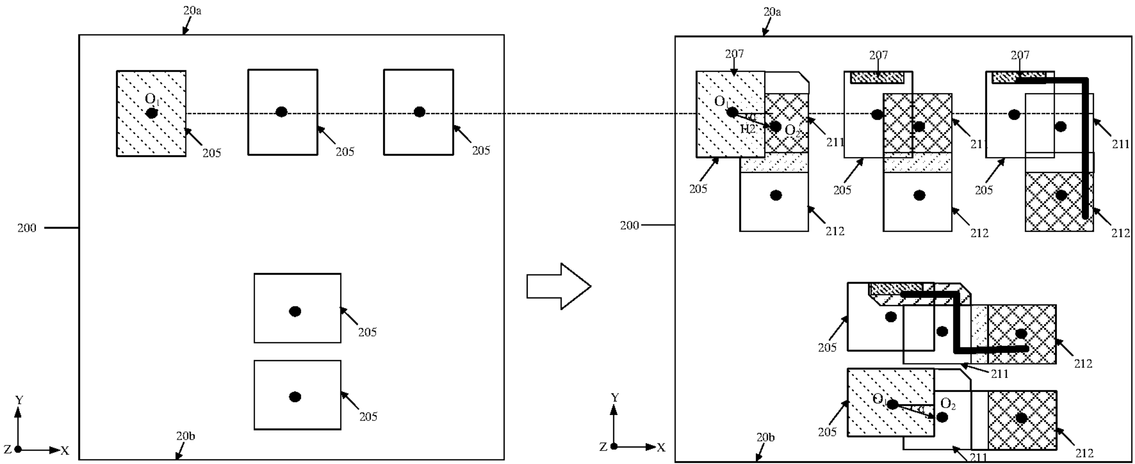
FIG. 4A is a first schematic diagram of relative positions of first pads in a T-shaped arrangement and second pads in a T-shaped arrangement according to an embodiment of the present disclosure.

Exemplarily, referring to FIG. 4A, the left hand of the arrow in FIG. 4A shows that three first pads 205 are arranged near the first edge of the semiconductor functional structure in parallel along the X-axis direction, while the two first pads 205 are arranged near the second edge of the semiconductor functional structure in parallel along the Y-axis direction. The right hand of the arrow in FIG. 4A shows that three RDLs are arranged close to the first edge of the semiconductor functional structure in parallel along the X-axis direction, and the second pads and the corresponding third pads in the three RDLs are arranged in parallel along the Y-axis direction. At the same time, two RDLs are arranged near the second edge of the semiconductor functional structure in parallel along the Y-axis direction, and the second pads and the corresponding third pads in the two RDLs are arranged in parallel along the X-axis direction; the dotted line in FIG. 3A shows the line where the center points of three first pads 205 are located.

It can be understood that, the second pads arranged near the second edge of the semiconductor functional structure and the corresponding third pads are arranged in parallel along the X-axis direction, which can reduce the risk that the RDL exceeds the second edge.

Figure 4B:
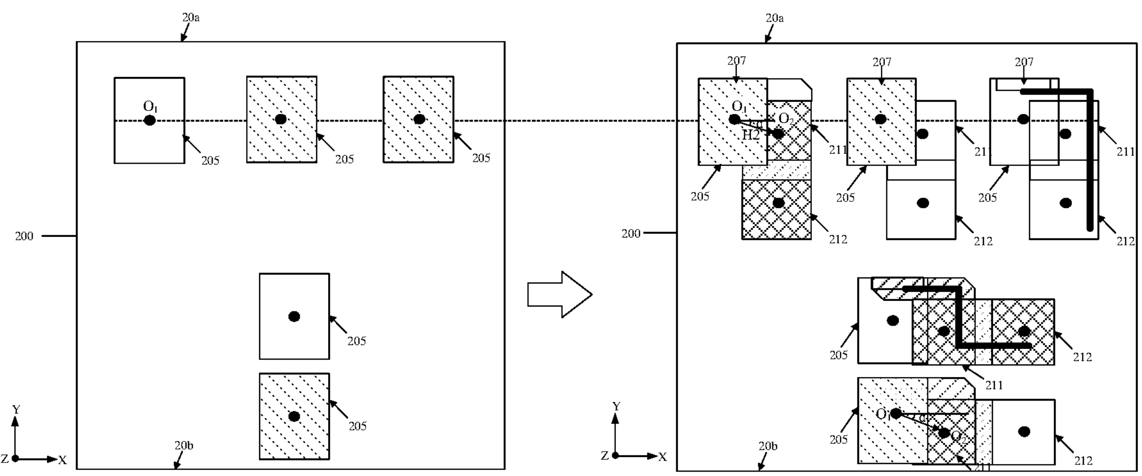
FIG. 4B is a second schematic diagram of relative positions of first pads in a T-shaped arrangement and second pads in a T-shaped arrangement according to an embodiment of the present disclosure.

It is to be noted that the first pads arranged near the second edge of the semiconductor functional structure in parallel along the Y-axis direction may be in exactly the same shape as the first pads arranged near the first edge of the semiconductor functional structure in parallel along the X-axis direction (as shown in FIG. 4B), or may be in the same shape as the first pads arranged near the first edge of the semiconductor functional structure in parallel along the X-axis direction after being rotated 90 degrees relative to the center points of the first pads arranged near the first edge of the semiconductor functional structure in parallel along the X-axis direction (as shown in FIG. 4A).

In some embodiments, the orthographic projection of the center point of the second pad on the plane where the interconnection layer is located is offset by a second distance in a third direction with respect to the center point of the corresponding first pad. The included angle between the third direction and the first direction is 45 degrees or 135 degrees. In other embodiments, the included angle between the third direction and the first direction is 0-45 degrees or 135-180 degrees, such as 15 degrees, 30 degrees, 150 degrees and 165 degrees.

Here, the second distance is a distance for which the probe card moves from the center point of each first pad to the center point of the corresponding second pad after completing the first-type test.

Exemplarily, referring to FIG. 4A or FIG. 4B, the center point $O_2$ of each second pad is offset by a second distance H2 in the third direction with respect to the center point $O_1$ of the corresponding first pad. The third direction is parallel to the surface of the semiconductor functional structure, and the included angle $\alpha$ between the third direction and the first direction is 45 degrees or 135 degrees.

It can be understood that when the included angle $\alpha$ between the third direction and the first direction is 45 degrees or 135 degrees, in other embodiments, the included angle between the third direction and the first direction is 0-45 degrees or 135-180 degrees, such as 15 degrees, 30 degrees, 150 degrees and 165 degrees, which can be compatible with the changes of two perpendicular directions at the same time, thereby ensuring that the offset directions and the offset distances of the center points of the second pads set in a T shape with respect to the center points of the corresponding first pads are equal.

In some embodiments, the shapes of each first pad include a long-strip shape, the shapes of the orthographic projection of a part of the RDLs on the plane where the interconnection layer is located include an L shape, and the shapes of the orthographic projection of the other part of the RDLs on the plane where the interconnection layer is located include a Z shape.

Figure 4C:
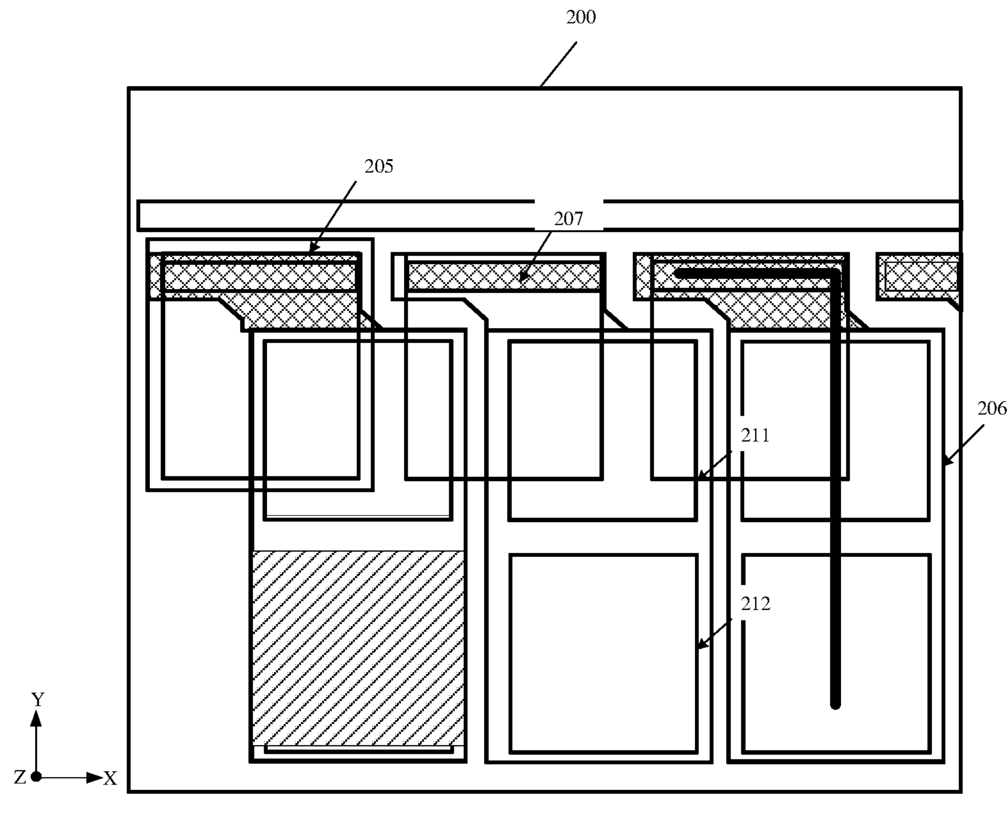
FIG. 4C is a third schematic diagram of relative positions of first pads in a T-shaped arrangement and second pads in a T-shaped arrangement according to an embodiment of the present disclosure.

Exemplarily, referring to FIG. 4*c*, the shapes of the orthographic projection of some of the N RDLs on the plane where the interconnection layer is located include an L shape.

Exemplarily, referring to FIG. 4A or FIG. 4B, the orthographic projections of multiple RDLs near the second edge 20*b* of the semiconductor functional structure on the plane where the interconnection layer is located are of a Z shape.

In each embodiment of the present disclosure, N first pads are arranged in a top metal layer to perform the test at a first running speed on the semiconductor functional structure; after the test at the first running speed is completed, second pads in one-to-one correspondence to the first pads are arranged in the RDLs on the first pads for performing the test at a second running speed on the semiconductor functional structure. By setting the center point of each second pad to be offset by an equal distance in the same direction with respect to the center point of the corresponding first pad, relative positions between the N first pads and the N second pads maintain exactly the same. In this way, the above two tests at different running speeds can be implemented through the same probe card, which can save the test cost and test time, and then reduce the production cycle and manufacturing cost compared with using two sets of probe cards to perform the test separately.

According to another aspect of the embodiments of the present disclosure, a semiconductor device is provided, which may include: a semiconductor functional structure and the package structure as described in the embodiments of the present disclosure.

In some embodiments, the semiconductor device may further include: a substrate and multiple stacked dies. Each die includes a semiconductor functional structure and a package structure located on the semiconductor functional structure. Each die is electrically connected to the substrate through a lead on a respective one of the third pads in the package structure.

Figure 5:
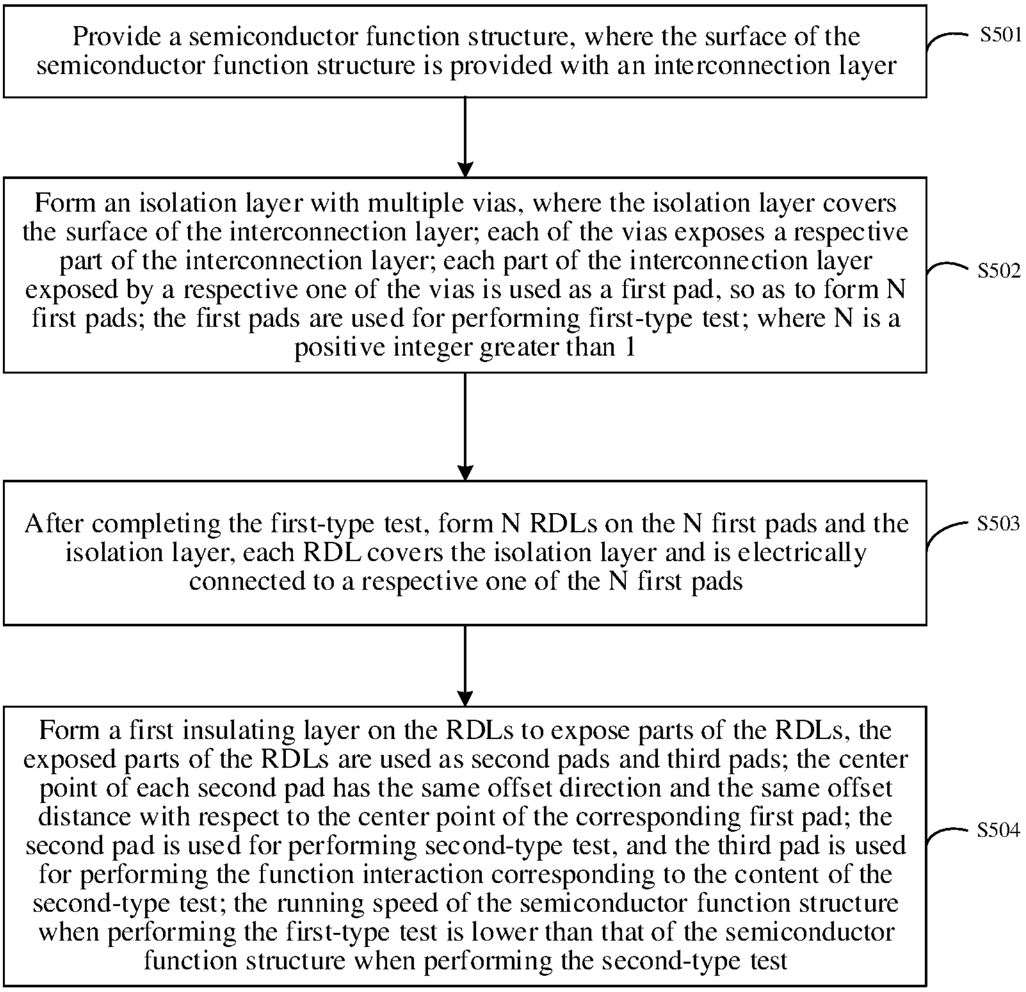
FIG. 5 is a flowchart of a method for manufacturing a package structure according to an embodiment of the present disclosure.

According to yet another aspect of the embodiments of the present disclosure, a method for manufacturing a package structure is provided. As shown in FIG. 5, the method for manufacturing a package structure provided by the embodiments of the present disclosure may include the following steps.

At S501, a semiconductor functional structure is provided. The surface of the semiconductor functional structure is provided with an interconnection layer.

At S502, an isolation layer with multiple vias is formed. The isolation layer covers the surface of the interconnection layer. Each of the vias exposes a respective part of the interconnection layer. Each part of the interconnection layer exposed by a respective one of the vias is used as a first pad, so that N first pads are formed. The first pads are used for performing the first-type test. N is a positive integer greater than 1.

At S503, after the first-type test is completed, N RDLs are formed on the N first pads and the isolation layer. Each RDL covers the isolation layer and is electrically connected to a respective one of the N first pads.

At S504, a first insulating layer is formed on the RDLs and exposes a part area of each of the RDLs. The exposed part areas of at least some of the RDLs are used as second pads and third pads. The center point of each second pad has the same offset direction and the same offset distance with respect to the center point of the corresponding first pad. The second pads are used for performing the second-type test, and the third pads are used for performing the function interaction corresponding to the content of the second-type test. The running speed of the semiconductor functional structure when performing the first-type test is lower than that of the semiconductor functional structure when performing the second-type test.

It should be understood that the steps shown in FIG. 5 are not exclusive and additional steps may also be performed before and after any step or between any steps in the illustrated operations. The sequence of the steps shown in FIG. 5 may be adjusted according to actual needs. FIG. 6A to FIG. 6D are section diagrams of a manufacturing process of a package structure according to an embodiment of the present disclosure. The method for manufacturing a package structure provided by the embodiments of the present disclosure is described in detail below in combination with FIG. 5 and FIG. 6A to FIG. 6D.

Figure 6A:
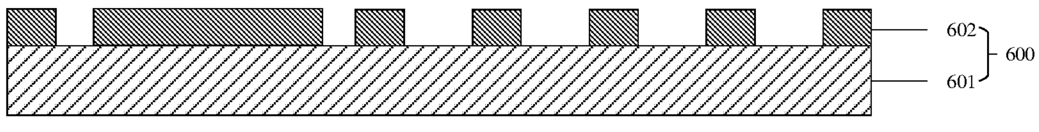
FIG. 6A is a first schematic diagram of a process for manufacturing an package structure according to an embodiment of the present disclosure.

At S501, referring to FIG. 6A, a semiconductor functional structure 600 is provided, which may include a semiconductor functional layer 601 and an interconnection layer 602. The operation of providing the semiconductor functional structure 600 may include that: a substrate (not shown in FIG. 6A) is provided, the semiconductor functional layer 601 is formed on the substrate, and the interconnection layer 602 is formed on the semiconductor functional layer.

Specifically, the semiconductor functional layer 601 includes a single thin film or multiple thin films, and has a conductive layer and/or a dielectric layer. According to actual needs, a variety of functional structures may be arranged in the semiconductor functional layer 601. Accordingly, the interconnection layer 602 is used for leading out electrical signals of the functional structures in the semiconductor functional layer 601 to operate the functional structures. In some embodiments, the interconnection layer 602 includes a top metal layer, which is not only used for leading out the electrical signals of the functional structure, but also for supporting the semiconductor functional structure 600.

Here, the interconnection layer may be formed on the semiconductor functional layer by Physical Vapor Deposition (PVD), Chemical Vapor Deposition (CVD), Atomic Layer Deposition (ALD) and other ways.

In some embodiments, the method may further include that: parts of the interconnect layer 602 are removed, and the area of the interconnect layer is reduced to reduce the parasitic capacitance generated by the interconnection layer. FIG. 6A shows a section view of a section of the interconnection layer 602 with parts removed. In practical applications, the parts in the interconnection layer are not truncated but interconnected, that is, in other cross sections, the parts in the interconnection layer may be continuous.

Figure 6B:
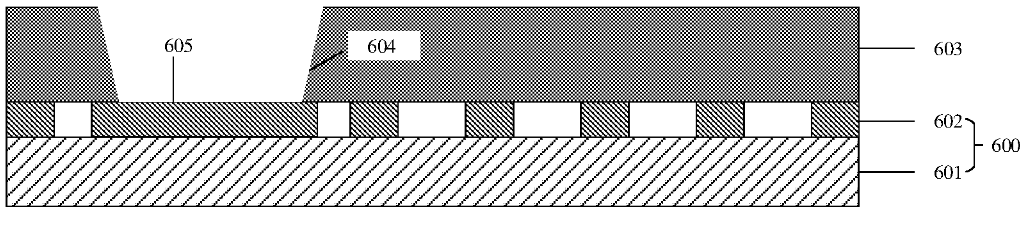
FIG. 6B is a second schematic diagram of a process for manufacturing an package structure according to an embodiment of the present disclosure.

At S502, referring to FIG. 6B, an isolation layer 603 is formed on the interconnection layer 602. The constituent materials of the isolation layer include, but are not limited to, tetraethyl orthosilicate. The processes for forming the isolation layer include, but are not limited to, PVD, CVD, ALD and other processes.

Next, parts of the isolation layer is removed to form multiple vias 604. Each of the vias exposes a respective part of the interconnection layer. Each part of the interconnection layer exposed by a respective one of the vias is used as a first pad 605, so that N first pads 605 are formed. The vias 604 may be of a cylindrical shape, or an inverted trapezoidal shape, or any proper shape. The cross-sectional area of an via includes the area of the orthographic projection of the via on the plane where the interconnection layer is located; for example, when the via is of the inverted trapezoidal shape, the cross-sectional area of the first pad is the minimum cross-sectional area of the via.

The first pad 605 may be used for performing the first-type test or performing the function interaction corresponding to the content of the first-type test, for example, leading out the bonding wire. The first-type test may be understood as some tests performed on the semiconductor functional structure at the low running speed. It is to be noted that, in a memory device, the running speed refers to the reading and writing speed of the memory device.

Figure 6C:
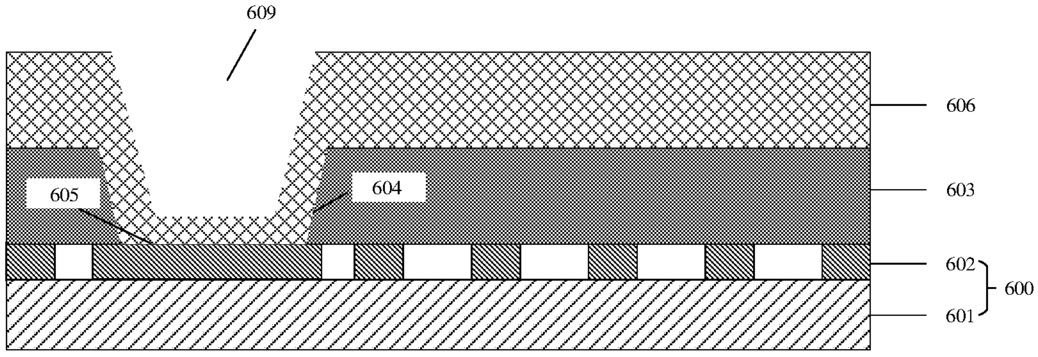
FIG. 6C is a third schematic diagram of a process for manufacturing an package structure according to an embodiment of the present disclosure.

At S503, referring to FIG. 6C, RDLs 606 are formed in the isolation layer 603 and the vias 604.

The specific way of forming the RDLs 606 on the isolation layer 603 includes that: a new wire pattern is formed on the isolation layer by means of exposure and development, and then each RDL is formed according to the new wire pattern by using the electroplating technology. each RDL includes a new wire path, and the new wire path is conductively connected with the interconnection layer. In some other embodiments, each RDL 606 may also be formed on a first pad 605 and the isolation layer 603 by a maskless deposition process. The maskless deposition process may be understood as forming an RDL directly on the first pad and the isolation layer without forming a mask.

Figure 6D:
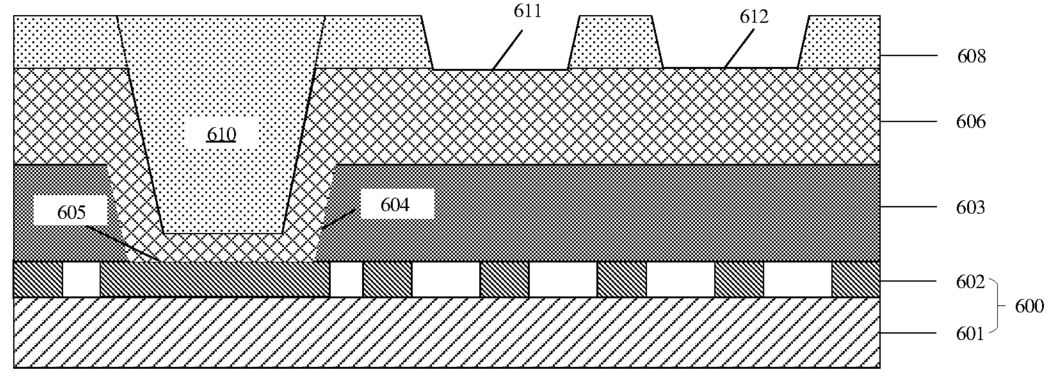
FIG. 6D is a fourth schematic diagram of a process for manufacturing an package structure according to an embodiment of the present disclosure.

At S504, referring to FIG. 6D, a first insulating layer 608 is formed on the RDLs 606.

Here, the way of forming the first insulating layer 608 includes, but is not limited to, PVD, CVD, ALD and other processes. The removing processes include, but are not limited to, an etching process, etc.

Next, parts of the first insulating layer 608 are removed to expose parts of the RDLs 606. Here, the exposed parts of the RDLs include the second pads 611 and the third pads 612. The second pads 611 are used for performing the second-type test, and the third pads 612 are used for performing the function interaction corresponding to the content of the second-type test. The second-type test may be understood as some tests performed on the semiconductor functional structure at the high running speed. Performing the function interaction corresponding to the content of the second-type test may be understood as leading out bonding wires on the third pads. Here, the position of the second pads 611 and the third pads 612 may be selected and set according to the actual needs.

It is to be noted that, in the present embodiment, referring to FIG. 6D, in addition to exposing parts of the RDLs to form the second pads and the third pads, the first insulating layer also exposes the RDLs located above the first pads to fill the subsequent second insulating layer 610 in the grooves 609 formed by the RDL, in this case, the density of the second insulating layer may be less than or equal to that of the first insulating layer. In other embodiments, the first insulating layer also covers the bottom and side wall of the grooves 609 formed by the RDLs, and the subsequent second insulating layer 610 is formed in the grooves 609 formed by the first insulating layer.

It is to be noted that the material of the second insulating layer may be the same as the material of the first insulating layer; accordingly, the second insulating layer may be formed in the same process step of forming the first insulating layer. The second insulating layer and the first insulating layer are an integrated structure.

In some other embodiments, the package structure may further include one or more conductive poles, and accordingly, the method may also include that: a conductive pole is formed on each first pad after the first-type test is completed. The operation of forming the RDL on the corresponding first pad and the isolation layer may include that: the RDL is formed on the conductive pole and the isolation layer. The RDL is electrically connected with the interconnection layer through the conductive pole. The method for forming the conductive pole includes, but is not limited to, PVD, CVD, ALD and other processes.

It is to be noted that, the offset direction and the offset distance of the center point of each second pad with respect to the center point of the corresponding first pad are equal, thus, after performing the first-type test, the same probe card can be aligned with the center points of all the second pads after moving a certain distance in a certain direction from the center point of the first pad, that is, the probe card can perform the second-type test directly on all the second pads without replacing the probe card with a new one.

Moreover, it is to be noted that, in the above embodiments of the present disclosure, the use of the package structure compatible with two types of tests enables the semiconductor functional structure to perform different types of tests in different manufacturing stages. However, it is to be noted that when designing the layout of the package structure, it is necessary to reserve positions for the vias of the RDL on the top metal layer, so as to ensure that there is no need to change technological processes of the top metal layer or any other photo-etched circuit boar when additional RDLs are required.

In some embodiments provided by the application, it is to be understood that the disclosed device and method may be implemented in a non-targeted manner. The device embodiment described above is only schematic, and for example, division of the units is only logic function division, and other division manners may be adopted during practical implementation. For example, multiple units or components may be combined or integrated into another system, or some characteristics may be neglected or not executed. In addition, coupling or direct coupling between the components is shown or discussed.

The units described as separate parts may or may not be physically separated, and parts displayed as units may or may not be physical units, and namely may be located in the same place, or may also be distributed to multiple network units. Part of all of the units may be selected according to a practical requirement to achieve the purposes of the solutions of the embodiments.

The characteristics disclosed in some method or device embodiments provided in the present disclosure may be freely combined without conflicts to obtain new method embodiments or device embodiments.

The above is only the specific implementation modes of the disclosure and not intended to limit the protection scope of the disclosure; any change or replacement that those skilled in the art can think of easily in the scope of technologies disclosed by the disclosure shall fall within the protection scope of the disclosure. Therefore, the scope of protection of the present disclosure shall be subject to the scope of protection of the claims.

In each embodiment of the present disclosure, N first pads are arranged in a top metal layer to perform the test at a first running speed on the semiconductor functional structure; after the test at the first running speed is completed, second pads in one-to-one correspondence to the first pads are arranged in the RDLs on the first pads for performing the test at a second running speed on the semiconductor functional structure. By setting the center point of each second pad to be offset by the equal distance in the same direction with respect to the center point of the corresponding first pad, relative positions between the N first pads and the N second pads maintain exactly the same. In this way, the above two tests at different running speeds can be implemented through the same probe card, which can save the test cost and test time, and then reduce the production cycle and manufacturing cost compared with using two sets of probe cards to perform the test separately.

What is claimed is:

1. A package structure, comprising:

an isolation layer with multiple vias, wherein the isolation layer covers a surface of an interconnection layer, each of the vias exposes a respective part of the interconnection layer, and the interconnection layer is arranged on a surface of a semiconductor functional structure;

N first pads, wherein each of the N first pads is formed by a respective part of the interconnection layer exposed by a corresponding one of the vias, where Nis a positive integer greater than 1;

N Redistribution Layers (RDLs), wherein each of the RDLs covers the isolation layer and is electrically connected to a respective one of the N first pads; and a first insulating layer, which is formed on the RDLs and exposes a part area of each of the RDLs;

wherein the exposed part areas of at least some of the RDLs comprise second pads and third pads, wherein a center point of each of the second pads has a same offset direction and a same offset distance with respect to a center point of a corresponding one of the first pads, the first pads and the second pads are used for testing when the semiconductor functional structure is at different running speeds respectively, and the third pads are used for performing function interaction corresponding to content tested by the second pads;

wherein the semiconductor functional structure and the package structure located on the semiconductor functional structure form a die;

some of the first pads are arranged near a first edge of the semiconductor functional structure in parallel along a first direction, and some of the second pads and corresponding ones of the third pads are arranged in parallel along a second direction and are arranged near the first edge, wherein the second direction is perpendicular to the first direction; and rest of all the first pads are arranged near a second edge of the semiconductor functional structure in parallel along the second direction, wherein the first edge and the second edge are two opposite edges of the semiconductor functional structure, and the second pads and the third pads corresponding to the rest of the first pads are arranged in parallel along the first direction.

2. The package structure of claim 1, wherein, the second pads are located at one end of the RDLs close to the first pads, and the third pads are located at another end of the RDLs away from the first pads.

3. The package structure of claim 1, wherein, each of the RDLs is in direct contact with a corresponding one of the first pads, and the package structure further comprises:

a second insulating layer, which is located in a groove enclosed by each RDL, wherein a hardness of a material of the second insulating layer is less than that of a material of the RDLs.

4. The package structure of claim 1, wherein the N first pads are arranged near a first edge of the semiconductor functional structure in parallel along a first direction;

at least some of the second pads and corresponding ones of the third pads are arranged in parallel along a second direction, wherein the second direction is perpendicular to the first direction.

5. The package structure of claim 4, wherein orthographic projection of the center point of each of the second pads on a plane where the interconnection layer is located is offset by a first distance in the second direction with respect to the center point of the corresponding first pad.

6. The package structure of claim 5, wherein shapes of orthographic projections of the RDLs on the plane where the interconnection layer is located comprise a long-strip shape.

7. The package structure of claim 1, wherein orthographic projection of the center point of each of the second pads on a plane where the interconnection layer is located is offset by a second distance in a third direction with respect to the center point of the corresponding first pad; an included angle between the third direction and the first direction is 45 degrees or 135 degrees.

8. The package structure of claim 7, wherein shapes of the first pads comprise a long-strip shape, shapes of orthographic projections of some of the RDLs on the plane where the interconnection layer is located comprise an L shape, and shapes of orthographic projections of others of the RDLs on the plane where the interconnection layer is located comprise a Z shape.

9. The package structure of claim 1, wherein, the package structure further comprises: conductive poles, each located between a respective one of the RDLs and a respective one of the first pads corresponding to the respective RDL; each of the RDLs is conductively connected with the interconnection layer through a respective one of the conductive poles.

10. The package structure of claim 9, wherein orthographic projection of each of the conductive poles on a plane where the interconnection layer is located overlaps a corresponding one of the first pads, and does not overlap orthographic projection of a corresponding one of the second pads and a corresponding one of the third pads on the plane where the interconnection layer is located.

* * * * *